(12) United States Patent
Tom et al.

(10) Patent No.: US 11,388,809 B2
(45) Date of Patent: Jul. 12, 2022

(54) SYSTEMS FOR CONTROLLING PLASMA REACTORS

(71) Applicant: ReCarbon, Inc., Santa Clara, CA (US)

(72) Inventors: Curtis Peter Tom, San Mateo, CA (US); Fei Xie, Sunnyvale, CA (US); Wei Li, San Jose, CA (US)

(73) Assignee: RECARBON, INC., Santa Clara, CA (US)

( * ) Notice: Subject to any disclaimer, the term of this patent is extended or adjusted under 35 U.S.C. 154(b) by 0 days.

(21) Appl. No.: 16/813,748

(22) Filed: Mar. 10, 2020

(65) Prior Publication Data

US 2020/0314994 A1  Oct. 1, 2020

Related U.S. Application Data

(60) Provisional application No. 62/823,508, filed on Mar. 25, 2019, provisional application No. 62/823,484, filed on Mar. 25, 2019, provisional application No. 62/823,505, filed on Mar. 25, 2019, provisional application No. 62/823,472, filed on Mar. 25, 2019.

(51) Int. Cl.
*H05H 1/46* (2006.01)
*H01J 37/32* (2006.01)
*G05B 19/05* (2006.01)

(52) U.S. Cl.
CPC .............. *H05H 1/46* (2013.01); *G05B 19/05* (2013.01); *H01J 37/32192* (2013.01); *H01J 37/32926* (2013.01); *H05H 1/4622* (2021.05)

(58) Field of Classification Search
CPC .............. H05H 1/46; H05H 2001/4622; H01J 37/32192; H01J 37/32201; H01J 37/32926; G05B 19/05; G05B 15/02
See application file for complete search history.

(56) References Cited

U.S. PATENT DOCUMENTS

| | | | |
|---|---|---|---|
| 2005/0250338 A1 | 11/2005 | Ohmi et al. | |
| 2006/0085082 A1* | 4/2006 | Asgeirsson | A61F 2/64 623/26 |
| 2007/0077763 A1* | 4/2007 | Xu | G03F 7/094 438/689 |
| 2010/0074810 A1* | 3/2010 | Lee | H05H 1/46 422/186.29 |
| 2011/0135842 A1* | 6/2011 | Faguet | H01J 37/32449 427/569 |

(Continued)

FOREIGN PATENT DOCUMENTS

KR    10-0476460 B1    3/2005

*Primary Examiner* — Abdullah A Riyami
*Assistant Examiner* — Syed M Kaiser
(74) *Attorney, Agent, or Firm* — Buchalter; Jason W. Croft

(57) ABSTRACT

The present invention provides a plasma generating system that includes: a programmable logic controller (PLC) and a plurality of reactor systems coupled to the PLC by a daisy chain network. Each of the plurality of reactor systems include: a microwave generator for generating microwave energy; and a power supply for providing electrical power to the microwave generator and including a controller, where the controller comprises: at least one microprocessor; and a module communicatively coupled to the at least one processor and including at least one of digital input-output (DIO) and analogue input-output (AIO).

21 Claims, 7 Drawing Sheets

(56) References Cited

U.S. PATENT DOCUMENTS

| | | | |
|---|---|---|---|
| 2013/0093322 A1* | 4/2013 | Borsuk | H05B 41/2806 |
| | | | 315/39.51 |
| 2015/0024594 A1* | 1/2015 | Fischer | H01L 21/67109 |
| | | | 438/689 |
| 2015/0039099 A1* | 2/2015 | Mizutani | G05B 15/02 |
| | | | 700/3 |
| 2015/0303056 A1* | 10/2015 | Varadarajan | C23C 16/325 |
| | | | 438/790 |
| 2015/0312963 A1 | 10/2015 | Kiernan et al. | |
| 2016/0174923 A1* | 6/2016 | Nie | A61B 6/505 |
| | | | 600/436 |
| 2016/0252892 A1 | 9/2016 | Valcore, Jr. et al. | |
| 2017/0069473 A1* | 3/2017 | Saito | C23C 16/4408 |
| 2017/0096737 A1* | 4/2017 | Hisano | C23C 16/455 |
| 2017/0133202 A1* | 5/2017 | Berry, III | H01J 37/32238 |
| 2017/0198395 A1* | 7/2017 | Nozawa | H01L 21/67069 |
| 2017/0345619 A1* | 11/2017 | Ohtake | H01J 37/32165 |
| 2017/0369996 A1* | 12/2017 | Imanaka | H01L 21/0217 |
| 2018/0061681 A1* | 3/2018 | Koshimizu | H01J 37/32174 |
| 2018/0108515 A1 | 4/2018 | Iwasaki | |
| 2019/0080886 A1* | 3/2019 | Kaplan | H03F 3/21 |

\* cited by examiner

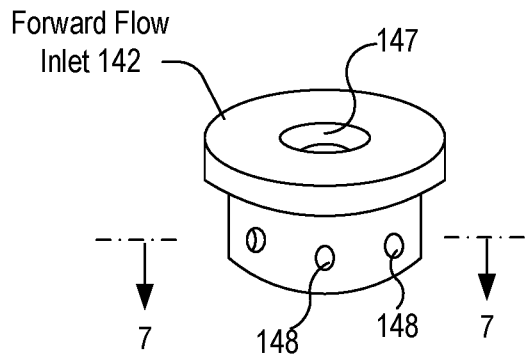
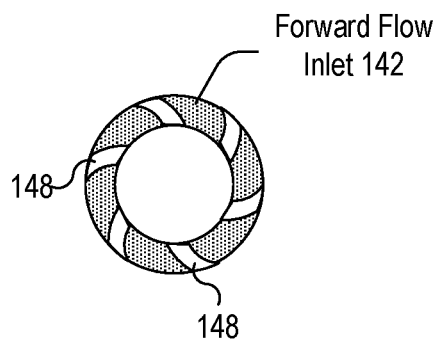
FIG. 6   FIG. 7
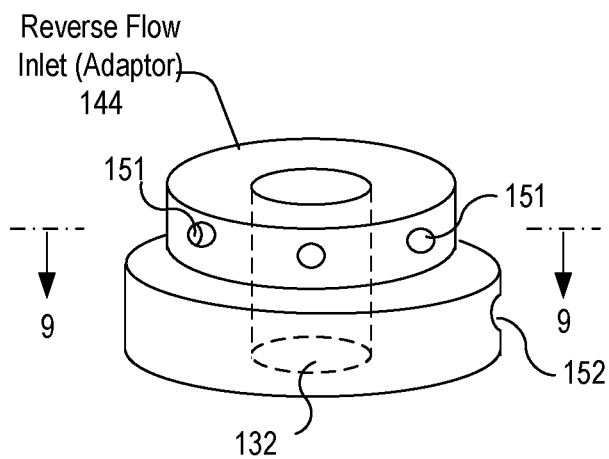
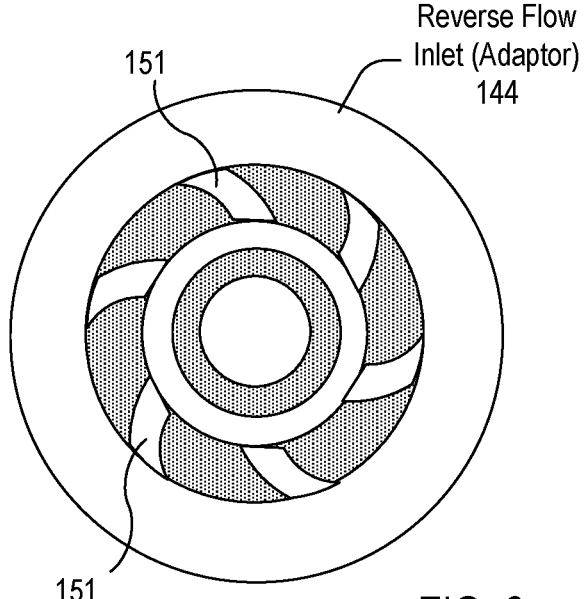
FIG. 8   FIG. 9

SYSTEMS FOR CONTROLLING PLASMA REACTORS

CROSS-REFERENCE TO PRIOR APPLICATIONS

This application claims priority of U.S. Patent Application Nos. 62/823,505; 62/823,508; 62/823,484 and 62/823,472, which are hereby incorporated by reference in their entirety.

BACKGROUND OF THE INVENTION

1. Field of the Invention

The present invention relates to plasma generators, and more particularly to systems for controlling a large number of plasma reactors.

2. Discussion of the Related Art

In recent years, microwave technology has been applied to generate various types of plasma. Typically, a microwave discharge, which is used as a plasma source, is achieved by coupling microwave energy into a discharge chamber containing gas to be processed. FIG. 1 shows a schematic diagram of a conventional plasma generating system. As depicted, the conventional plasma generating system 10 includes: a programmable logic controller (PLC) 12; a plurality of digital input-output/analogue input-output (DIO/AIO) modules 14a-14n; and a plurality of reactor systems 16a-16n that include a plurality of power supplies 17a-17n and a plurality of reactors 18a-18n. The DIO/AIO modules 14a-14n are connected to the PLC 12 and the reactors 18a-18n via the cable harnesses 15a-15n, respectively. The PLC 12 is also connected to the plurality of power supplies 17a-17n via the cables 13a-13n, where each power supply provides electrical power to a corresponding reactor.

Typically, each cable harness (e.g. 15a) includes a plurality of electrical wires, where each wire is connected to the DIO/AIO module 14a and a sensor/component of the reactor 18a. For instance, the reactor 18a includes sensors that transmit electrical signals associate with measured physical quantities to the DIO/AIO module 14a, and the DIO/AIO device 14a in turn processes the signals and transmits the processed signals to the PLC 12. To increase the throughput of the plasma generating system 10, the number of reactor systems 16a-16n may be increased, resulting in significant increase in the total number of electrical wires in the cable harnesses 15a-15n as well as the cables 13a-13n. The increase in the number of wires/cables decreases the reliability in cable connections, raises safety issues and increases the installation/maintenance costs.

Furthermore, the plasma generating system 10 has a centralized control architecture, i.e., the PLC 12 simultaneously controls/monitors the power supplies 17a-17n as well as multiple components of the reactors 18a-18n via the DIO/AIO modules 14a-14n. Typically, the PLC 12 contains a central processing unit (CPU), random access memory (RAM) and electrically erasable programmable read only memory (EEPROM), and the CPU executes the program stored in the EEPROM and temporary data and code are stored in RAM. As the number of reactor systems 16a-16n increases, the latency in command and control between the PLC 12 and reactor systems 16a-16n increases, and, when the number of reactor systems 16a-16n exceeds a certain threshold value, the required computational power to control the plasma generating system 10 reaches beyond the maximum capacity of the PLC 12, causing the latency to become unacceptable. Thus, in the conventional systems, the computational power, digital/analog inputs/outputs, and electrical harnesses need to scale up to meet functional and safety requirements, resulting in large, expensive, and inherently less reliable systems.

As such, there is a need for a system for controlling a large number of plasma reactors that has enhanced scalability, safety and reliability without compromising the installation/maintenance costs.

SUMMARY OF THE INVENTION

According to one aspect of the present invention, a plasma generating system that includes: a microwave generator for generating microwave energy; and a power supply for providing electrical power to the microwave generator and including a controller. The controller includes: at least one microprocessor; and a module communicatively coupled to the at least one processor and including at least one of digital input-output (DIO) and analogue input-output (AIO).

According to another aspect of the present invention, a plasma generating system that includes: a programmable logic controller (PLC) and a plurality of reactor systems coupled to the PLC by a daisy chain network. Each of the plurality of reactor systems include: a microwave generator for generating microwave energy; and a power supply for providing electrical power to the microwave generator and including a controller, where the controller comprises: at least one microprocessor; and a module communicatively coupled to the at least one processor and including at least one of digital input-output (DIO) and analogue input-output (AIO).

BRIEF DESCRIPTION OF THE DRAWINGS

FIG. 6 shows a perspective view of a forward flow inlet according to embodiments of the present disclosure.

FIG. 7 shows a cross sectional view of the forward flow inlet in FIG. 6, taken along the line 7-7, according to embodiments of the present disclosure.

FIG. 8 shows a perspective view of a reverse flow inlet according to embodiments of the present disclosure.

FIG. 9 shows a cross sectional view of the reverse flow inlet in FIG. 5, taken along the line 9-9, according to embodiments of the present disclosure.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

Figure 1:
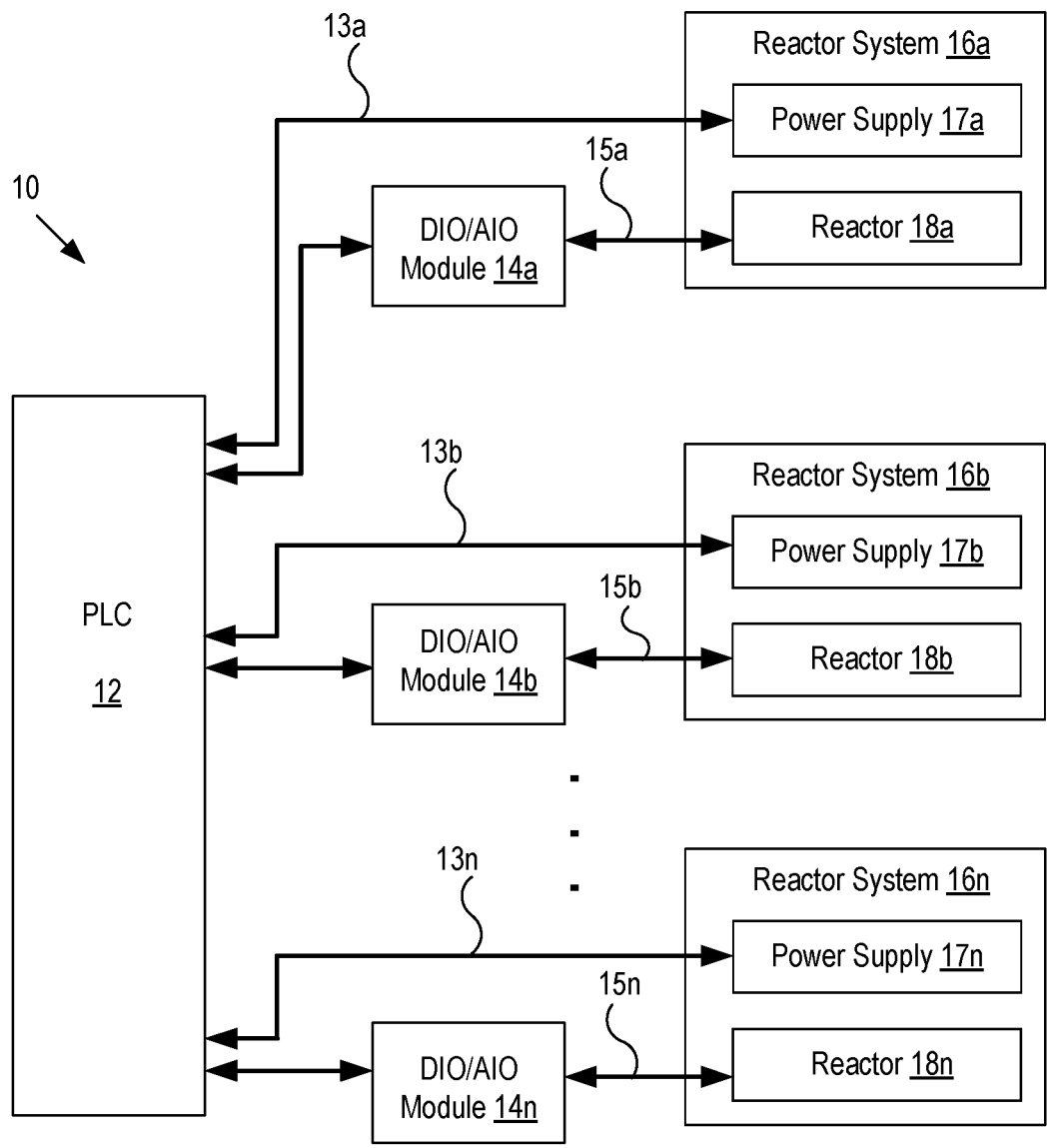
FIG. 1 ("FIG. 1") shows a schematic diagram of a conventional plasma generating system.
Figure 2:
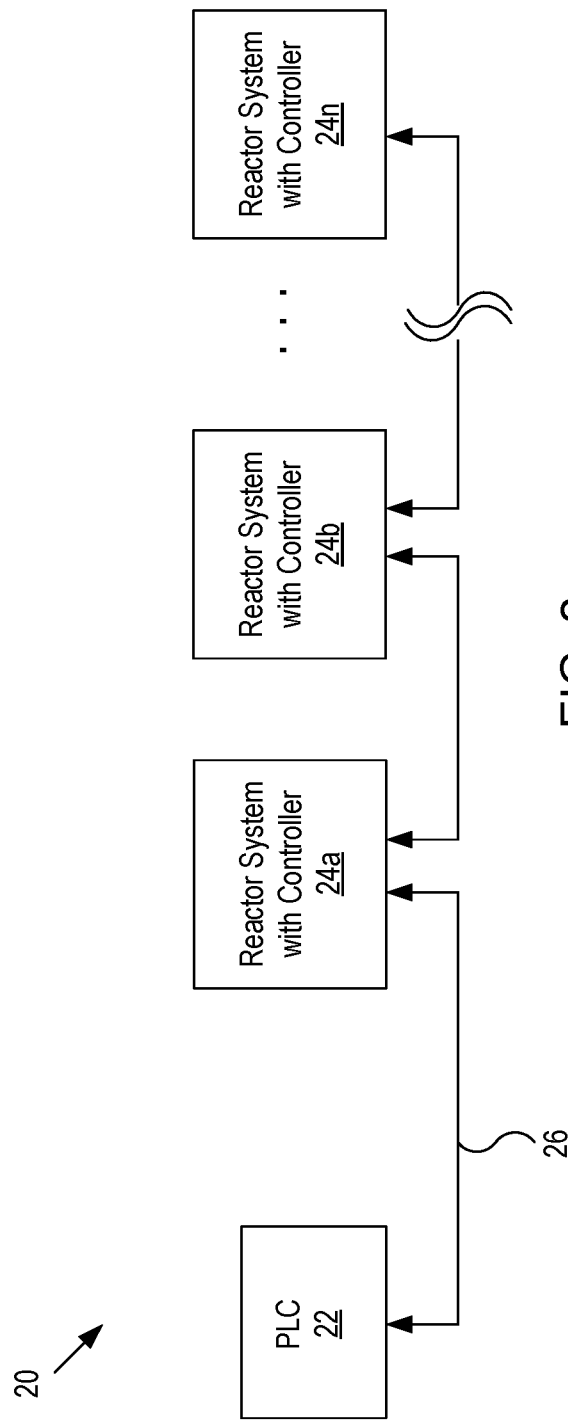
FIG. 2 shows a schematic diagram of a plasma generating system according to embodiments of the present disclosure.
Figure 3:
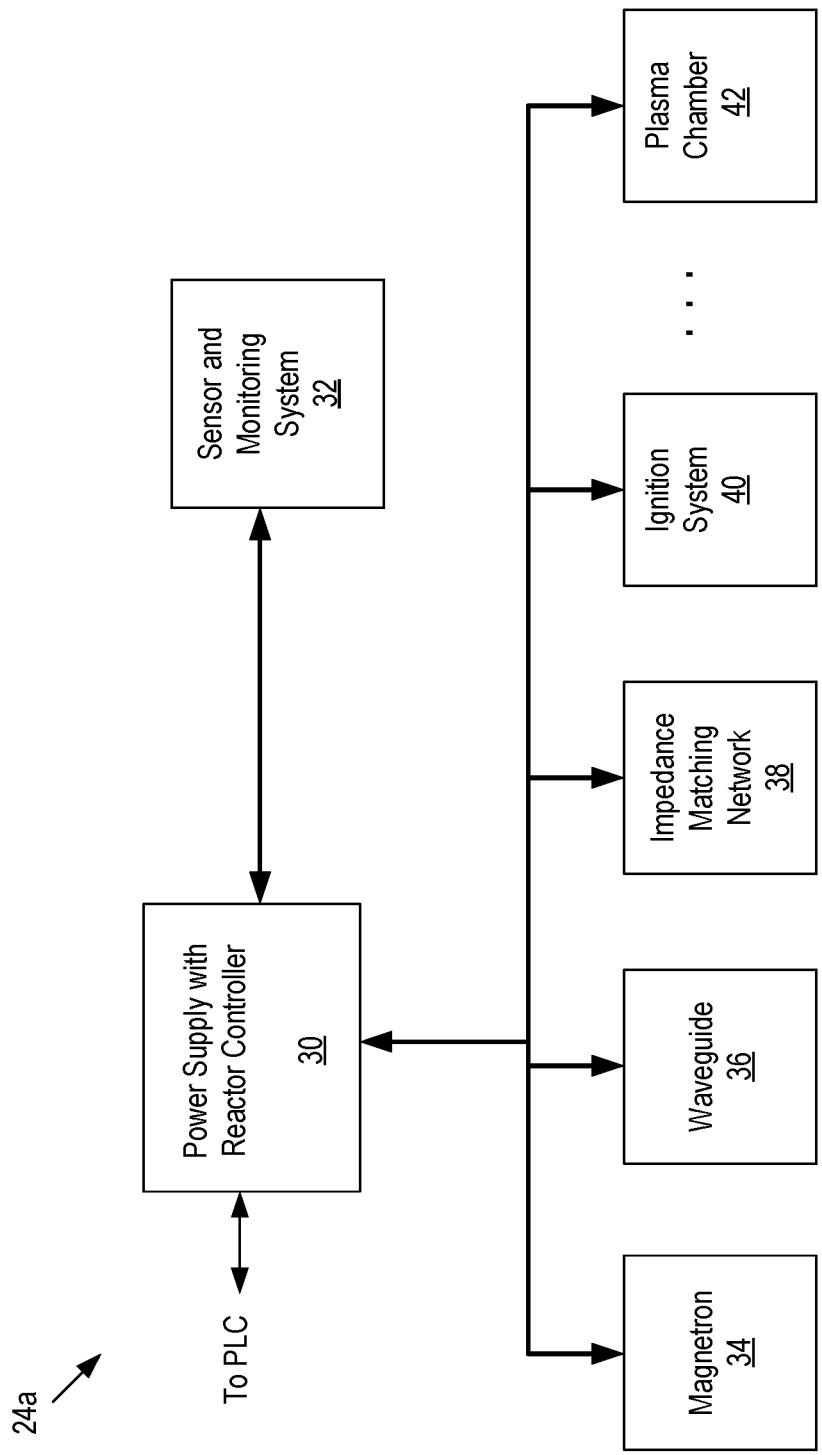
FIG. 3 shows a schematic diagram of an exemplary reactor system having a controller according to embodiments of the present disclosure.
Figure 4:
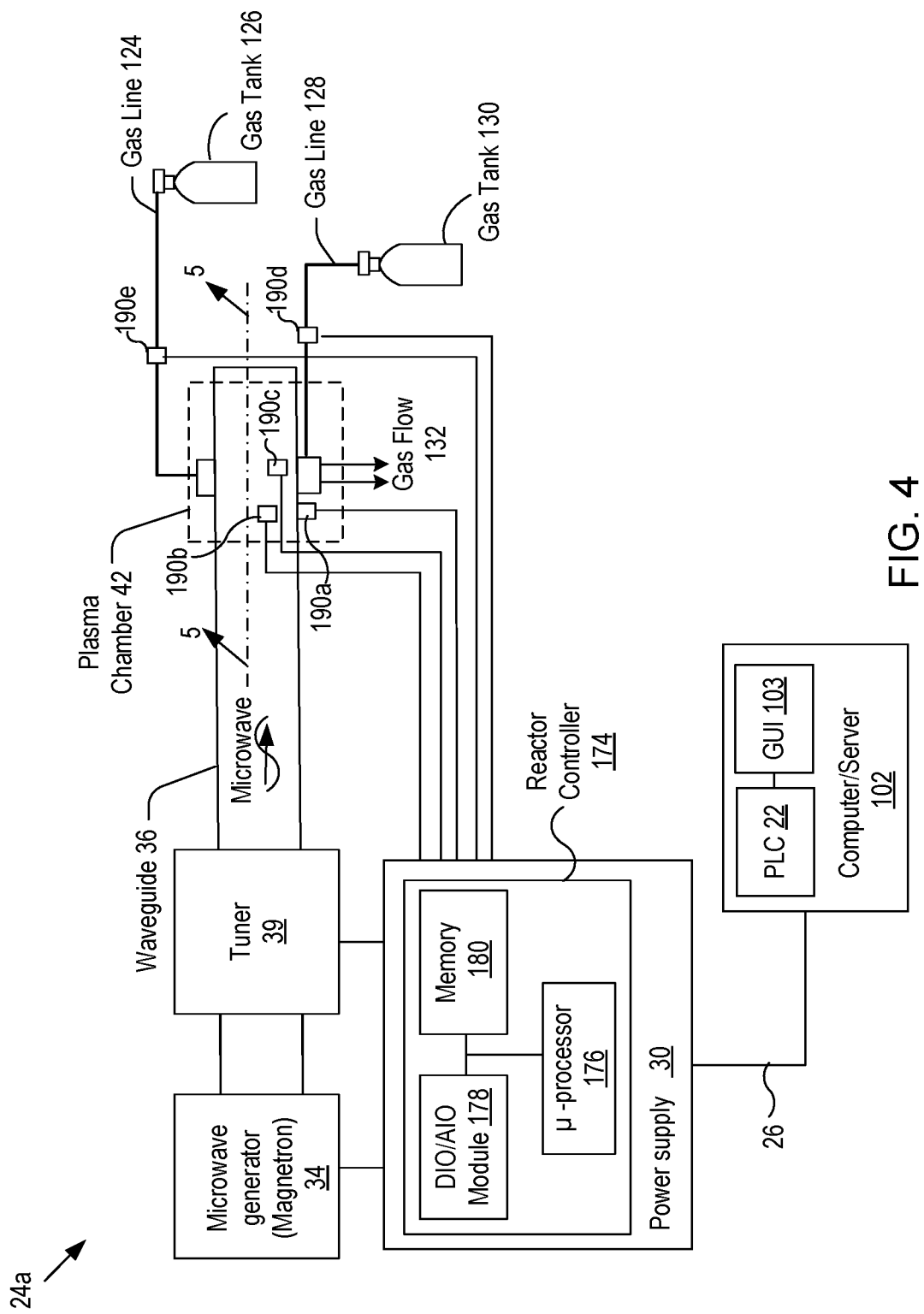
FIG. 4 shows a schematic diagram of an exemplary reactor system having a controller according to embodiments of the present disclosure.

FIG. 2 shows a schematic diagram of a plasma generating system 20 according to embodiments of the present disclosure. FIG. 3 shows a schematic diagram of an exemplary reactor system 24a according to embodiments of the present disclosure. FIG. 4 shows a schematic diagram of an exemplary reactor system 24a according to embodiments of the present disclosure. Hereinafter, the reactor system 24a is illustrated as a system for generating plasma using microwave energy, even though the reactor system 24a may generate plasma using other source of energy.

In embodiments, the plasma generating system 20 includes: a PLC system (or shortly PLC) 22; and a plurality of reactor systems 24a-24n. In some cases, to increase the throughput of the system, the plurality of reactor systems 24a-24n may number in the tens, hundreds or more. In embodiment, the reactor systems 24a-24n are daisy chained to the PLC 22 by a cable 26, such as Category 6 Ethernet cable, and communicate to the PLC 22 using a suitable communication protocol, such as EtherNet/IP or other suitable process automation protocols.

In embodiments, the reactor system 24a includes; a power supply 30 having a reactor controller; sensor and monitoring systems 32; a magnetron 34 for generating microwave energy; a waveguide 36 through which the microwave energy generated by the magnetron 34 flows; an impedance matching network 38 coupled to the waveguide 36 and configured to reduce the amount of microwave energy retrogressing toward the magnetron 34; an ignition system 40 for igniting the plasma, and plasma chamber 42. In embodiments, the power supply 30 is communicatively coupled to the rest of the components in the reactor system 24a. It is noted that FIG. 3 does not show the exhaustive list of components of the reactor system 24a; instead, the components of the reactor system 24a are divided into blocks for the purpose of illustration.

In embodiments, the sensor and monitoring system 32 includes one or more sensors for generating electrical signals associated with operation of the reactor system 24a. For instance, the sensor and monitoring system 32 includes one or more sensors, such as 190a-190c, for measuring thermophysical quantities, such as pressure and temperature, and one or more monitoring devices that monitor the plasma health using the signals from one or more sensors. In another example, the sensor and monitoring system 32 includes one or more flow rate sensors, such as 190d (and 190e), for measuring flow rate of the gas flowing through the gas line 128 (and 124) from the gas tank 130 (and 126). In embodiments, the sensor 190d (and 190e) and a gas servo valve for controlling the flow rate may form an integral body. (Hereinafter, the reference numeral 190d (and 190e) is referred to as both sensor and gas servo valve.) In yet another example, the sensor and monitoring system 32 includes an optical sensor that measures the intensity of light from the plasma at various wavelength ranges and monitors the plasma health.

As depicted in FIG. 4, the power supply 30 includes a reactor controller 174 that controls and monitors the components of the reactor system 24a. In embodiments, the reactor controller 174 includes; at least one microprocessor (p-processor) 176; a DIO/AIO module 178 communicatively coupled to the p-processor 176; and a memory 180 communicatively coupled to the p-processor 176. In embodiments, the DIO/AIO communicates data with various components 32-42 in FIG. 3 as well as the p-processor 176.

In embodiments, the DIO/AIO module 178 includes one or more DIO devices (or simply DIOs) and/or one or more AIO devices (or simply AIOs), where the DIOs and AIOs are preferably integrated into a printed circuit board, to thereby reduce the cost, size and complexity of the system wiring harness. In embodiments, each DIO device (or AIO) is an interface that relays digital (or analog) signals from sensors, transducers and mechanical devices to other electronic circuits and devices.

Unlike in the conventional system 10 where the PLC (which is also referred to as "central controller") 12 is directly connected to and directly communicates data to the DIO/AIO modules 14a-14n, the PLC 22 is not directly connected to DIO/AIO modules 178; instead, the PLC 22 is directly connected only to the power supply 30 of each reactor system (e.g. 24a) by the daisy chain network of communication cables 26. Thus, unlike the conventional PLC 12 that operates as a central control system, the PLC 22 and the power supplies 30 form a distributed control system/architecture. In embodiments, since the DIO/AIO module 178 is not directly connected to the PLC 22, the number of wires/cables connected to the PLC 22 does not increase as the number of reactor systems 24a-24n increases, i.e., the reliability in cable connections is not affected by the number of reactor systems 24a-24n.

In embodiments, the distributed control architecture allows the control and monitoring responsibilities to be off loaded from the PLC 22 to the reactor controller (which is also referred to as local controller) 174 that resides in the power supply 30 of each reactor system (e.g. 24a). This distributed control architecture has the advantages of reducing the latency in command and control between the reactor systems 24a-24n and the PLC 22 since the local controller 174 is tasked with monitoring and controlling only one reactor system rather than having the PLC 12 manage hundreds of reactor systems simultaneously. In embodiments, the distributed control architecture allows reactor systems 24a-24n to operate independently from each other, allowing the engineer to check/repair each reactor system individually. As such, distributed control architecture give the plasma generating system 20 greater flexibility, scalability and maintainability.

In embodiments, the PLC 22 sends a simple command, such as, turn on (or turn off) the reactor system via the cable 26. Then, the reactor controller 174 takes proper steps to ignite the plasma and report back to the PLC 22 that the operation was successful (or not). Also, the reactor controller 174 continuously monitors the health of plasma once ignition has occurred and, optionally, reports the health condition to the PLC 22 at a preset time interval. In embodiments, the PLC 22 is a standalone device having the capability to support a graphic user interface (GUI) for interface with a human operator. In alternative embodiments, the PLC 22 is included in a computer/server 102 that has a GUI 103 for human interface.

As depicted in FIG. 4, the reactor system 24a includes a tuner 39 that corresponds to the impedance matching network 38 in FIG. 3 and reduces the amount of microwave energy retrogressing toward the magnetron 34. It is noted that the impedance matching network 38 may include other suitable components, such as isolator (not shown in FIG. 4) for dissipating retrogressing microwaves that travel toward the magnetron 34.

Figure 5:
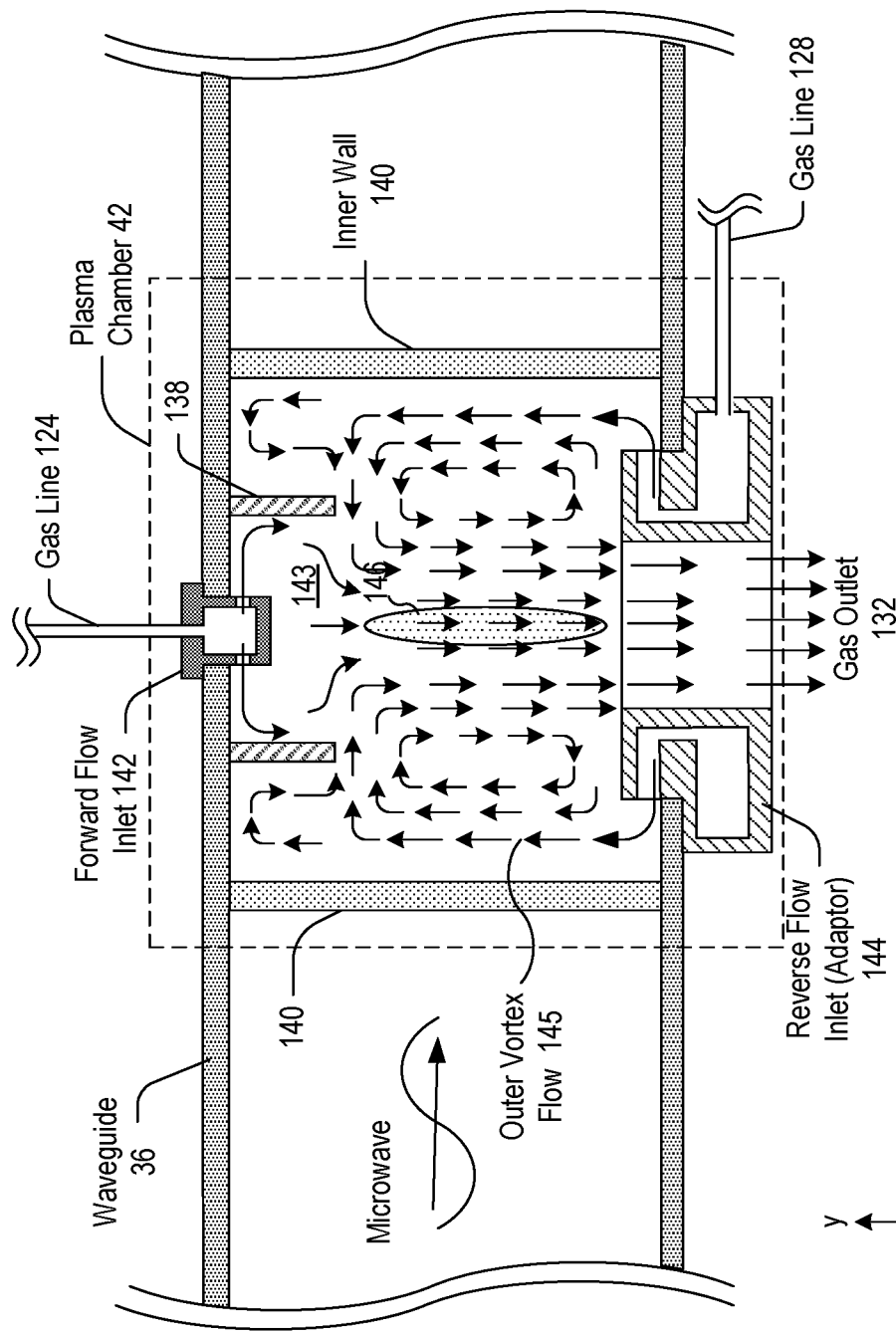
FIG. 5 shows a cross sectional view of the plasma chamber in FIG. 4, taken along the line 5-5, according to embodiments of the present disclosure.

FIG. 5 shows a cross sectional view of a plasma chamber 42 in FIG. 4, taken along the line 5-5 (i.e. cut along a plane parallel to the paper), according to embodiments of the present disclosure. As depicted, the plasma chamber 42 includes: an inner wall(s) 140; a plasma stabilizer 138; a forward flow inlet 142 connected to the gas line 124 and configured to introduce the forward flow into the plasma chamber; and a reverse flow inlet (which is referred to as "adaptor") 144 connected to the gas line 128 and configured to introduce the reverse flow into the plasma chamber. Here, the term plasma cavity refers to the enclosed space that is surrounded by the inner wall 140, waveguide 36, forward flow inlet 142 and adaptor 144, where the reverse flow gas and forward flows are processed/reformed in the plasma cavity by the microwave energy transmitted via the waveguide 36.

In embodiments, the inner wall 140 is formed of a material that is transparent to the microwave energy, such as quartz or ceramic. In embodiments, the inner wall 140 is formed of any other suitable dielectric material that is desirable for uniform flow, thermal resistance, chemical resistance, and electromagnetic transparency. In embodiments, the inner wall 140 has preferably, but not limited to, a shape of hollow circular cylinder.

FIG. 6 shows a perspective view of the forward flow inlet 142 according to embodiments of the present disclosure. FIG. 7 shows a cross sectional view of the forward flow inlet 142, taken along the line 7-7, according to embodiments of the present disclosure. As depicted, the forward flow inlet 142 has a hole/adaptor 147 for coupling to the gas line 124 and one or more gas passageways 148 that are formed in the wall thereof. In embodiments, the exits of the gas passageways 148 are located inside the plasma stabilizer 138 so that the plasma stabilizer 138 forms an inner vortex flow 143 using the flow exiting the gas passageways 148. In embodiments, the inner diameter of the plasma stabilizer 138 may be varied to adjust the outer diameter of the inner vortex flow 143. In embodiments, as discussed above, the plasma stabilizer 138 may have a shape of hollow circular cylinder and disposed concentrically to the forward flow inlet 142.

In embodiments, each gas passageway 148 is arranged to impart spiral motion to the forward flow as the forward flow enters the plasma cavity via the gas passageway 148. In embodiments, each gas passageway 148 may be curved to enhance the vorticity of the forward flow. In embodiments, the forward flow inlet 142 is formed of any suitable material, such as dielectric material or metal.

Figure 10:
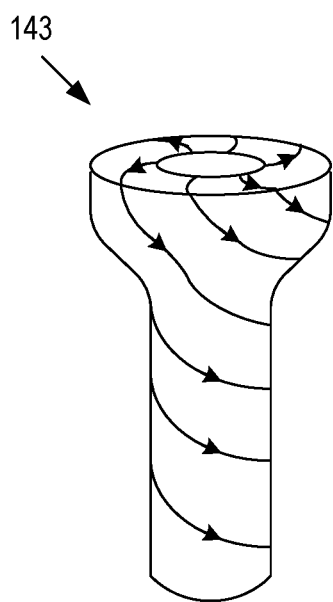
FIG. 10 shows a perspective view of an inner vortex flow according to embodiments of the present disclosure.

In embodiments, the plasma stabilizer 138 is formed of material that is transparent to the microwave energy, and preferably formed of the same material as the inner wall 140. In embodiments, the plasma stabilizer 138 is attached to the waveguide 36, protruding into the plasma cavity, where the axial direction of the plasma stabilizer 138 is parallel to the y-axis. In embodiments, as discussed above, the inner wall 140 may have a shape of a hollow circular cylinder and the plasma stabilizer 138 may be installed concentrically to the inner wall 140. In embodiments, the forward flow inside the plasma stabilizer 38 forms the inner vortex flow 143 and proceeds toward the other end of the waveguide 36, more specifically toward the gas outlet 132. FIG. 10 shows a perspective view of the inner vortex flow 143 according to embodiments of the present disclosure. As depicted, the forward flow (or equivalently, inner vortex flow) travels the length of the inner wall 140 in a helical motion until the inner vortex flow exits the gas outlet 132.

In embodiments, upon ignition of a plasma plume (or shortly, plasma) 146 by a plasma igniter (not shown in FIG. 5), the plasma 146 is sustained by the microwave energy transmitted by the microwave generator 34. In embodiments, the plasma 146 is located within the inner vortex flow 143 so that the gas particles of the inner vortex flow 143 pass through the plasma 146. In embodiments, the plasma stabilizer 138 determines the outer diameter of the inner vortex flow 143, preventing the forward flow from bypassing the plasma 146 before exiting the plasma cavity through the gas outlet 132. In embodiments, the plasma stabilizer 138 aids in keeping the plasma 146 stable by separating the inner vortex flow 143 from the outer vortex flow 145.

FIG. 8 shows a perspective view of the adaptor 144 according to embodiments of the present disclosure. FIG. 9 shows a cross sectional view of the adaptor 144, taken along the line 9-9, according to embodiments of the present disclosure. As depicted, the adaptor 144 has a hole/adaptor 152 for coupling to the gas line 128, a hole to form the gas outlet 132, and one or more gas passageways 151 that are formed in the wall thereof. In embodiments, each gas passageway 151 is arranged to impart spiral motion to the reverse flow as the reverse flow enters the plasma cavity via the gas passageway 151. In embodiments, each gas passageway 151 may be curved to enhance the vorticity of the reverse flow. In embodiments, the adaptor 144 is formed of preferably, but not limited to Ni alloy, such as Inconel or Hastelloy.

Figure 11:
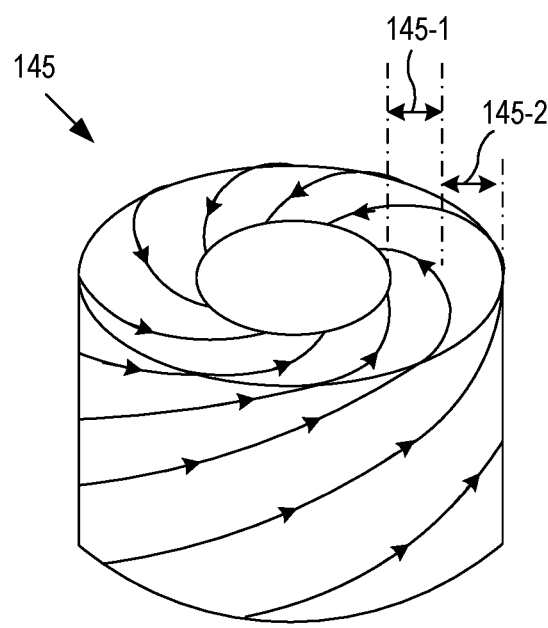
FIG. 11 shows a perspective view of an outer vortex flow according to embodiments of the present disclosure.

In embodiments, the reverse flow exiting the adaptor 144 travels toward to the inner wall 140 and then proceeds upwardly (y-axis direction) toward the other end of the waveguide 36 along the inner wall 140 in a helical motion. Subsequently, the reverse flow reverses the flow direction to proceed downwardly and form an outer vortex flow 145. In embodiments, the rotational axis of the outer vortex flow 145 is substantially parallel to the y-axis. FIG. 11 shows a perspective view of the outer vortex flow 145 according to embodiments of the present disclosure. As depicted, the outer vortex flow 145 has a hollow cylinder shape and has two flow regions: inner downward flow region 145-1 and an outer upward flow region 145-2. In embodiments, the inner vortex flow 143 is disposed in the middle hollow portion of the outer vortex flow 145 and surrounded by inner downward flow region 145-1. It is noted that the gas from the forward flow inlet 142 is mixed with the flow from the adaptor 144 to form the inner vortex flow 143.

In embodiments, the outer vortex flow 145 surrounds the inner vortex flow 143, to thereby shield the inner wall 140 from the plasma 146. In embodiments, the reverse flow exiting the adaptor 144 may have the ambient temperature and take heat energy from the inner wall 140 as the outer vortex flow 145 travels upwardly along the inner wall 140 in the helical motion.

In embodiments, the plasma 146 is used to reform the inlet gas to the desired product gas, where the inlet gas is introduced into the plasma cavity by the forward flow inlet 142 and adaptor 144. In embodiments, the gas composition of the inner vortex flow exiting the forward flow inlet 142 includes $CO_2$, $CH_4$ and $O_2$, and the gas exiting the gas outlet 132 includes CO and H2 as well as a non-reacted portion of forward flow gas. In embodiments, the preferred distribution for the forward flow is 5%-95% by mass of the total flow into the plasma chamber 42. In embodiments, the reverse flow may have the same gas composition of the forward flow. In alternative embodiments, the forward flow may have different gas composition from the reverse flow. Also, the gas composition of the forward flow (and/or reverse flow) may be changed during operation. For instance, the forward flow may include a slug of argon to aid ignition of the plasma 146. In embodiments, the reactor controller 174 adjusts the gas compositions and flow rates of the forward and reverse flows to enhance the plasma stability and efficiency of the chemical reaction in the plasma chamber 42.

As discussed above, the reactor controller 174 is coupled to various electrical and/or mechanical control devices/mechanisms in the reactor system 24a. In embodiments, the reactor controller 174 may form a feedback control system. For instance, the sensor (e.g. 190a) may be a pressure sensor that measures the pressure inside the plasma chamber 42, where the signal from the pressure sensor 190a is processed by the DIO/AIO module 178 and sent to the p-processor 176. If the p-processor 176 determines that the pressure is too low (or too high), the p-processor 176 sends a control signal to the gas servo valve 190d (and/or 190e) through the DIO/AIO module 178 to adjust the flow rate in the gas line 128, forming a feedback control mechanism for controlling the pressure inside the plasma chamber 42.

It is noted that the plasma chamber 42 in FIG. 4 may have different components and arrangement of the components. For instance, the plasma chamber may not include the forward flow inlet 142. In another example, the plasma stabilizer 138 may be mounted on the reverse flow inlet 144. The description of various embodiments of the plasma chamber 42 can be found in a copending U.S. patent application Ser. No. 16/752,689, entitled "Plasma reactor for processing gas," filed on Jan. 26, 2020, which is hereby incorporated by reference in its entirety.

It shall be noted that the computer 102 may be implemented in any instruction-execution/computing device or system capable of processing data, including, without limitation phones, laptop computers, desktop computers, and servers. The present disclosure may also be implemented into other computing devices and systems. Furthermore, aspects of the computer 102 may be implemented in a wide variety of ways including software (including firmware), hardware, or combinations thereof. For example, the functions to practice various aspects of the computer 102 may be performed by components that are implemented in a wide variety of ways including discrete logic components, one or more application specific integrated circuits (ASICs), and/or program-controlled processors. It shall be noted that the manner in which these items are implemented is not critical to the present disclosure.

It is noted that the reactor controller 174 may include other suitable electrical component that are necessary for operating the p-processor 176 and the DIO/AIO module 178. For instance, the memory 180 may be in the form of random-access memory (RAM), read-only memory (ROM) and/or EEPROM. Similarly, the computer/server 102 may include other suitable electrical components that are necessary for operating the PLC 22 and the GUI 103. For instance, the computer/server 102 may include: a central processing unit (CPU); various input device(s), such as a keyboard, mouse, or stylus; a scanner; one or more storage devices, such as magnetic tape or disk, or an optical medium; a printer controller for communicating with a printer; one or more communication devices that enables connection to remote devices through any of a variety of networks including the Internet, an Ethernet cloud, an FCoE/DCB cloud, a local area network (LAN), a wide area network (WAN), a storage area network (SAN) or through any suitable electromagnetic carrier signals including infrared signals.

It will be appreciated to those skilled in the art that the preceding examples and embodiment are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure.

What is claimed is:

1. A plasma generating system, comprising:
    a microwave generator for generating microwave energy;
    a power supply for providing electrical power to the microwave generator and including a controller that comprises:
        at least one microprocessor; and
        a module communicatively coupled to the at least one processor and including at least one of digital input-output (D10) and analogue input-output (A10),
    a waveguide coupled to the microwave generator and configured to transmit the microwave energy therethrough;
    an inner wall disposed within the waveguide to define a plasma cavity, a plasma being generated within the plasma cavity using the microwave energy;
    an adaptor mounted on a bottom side of the waveguide and including one or more passageways through which a first gas is introduced into the plasma cavity and configured to generate a first vortex flow within the plasma cavity using the first gas, the adaptor having a through hole through which a gas that is processed by the plasma and moves toward the bottom side of the waveguide exits the plasma cavity; and
    a plasma stabilizer having a shape of a circular hollow cylinder and installed on a top side of the waveguide and protruding into the plasma cavity, a longitudinal direction of the plasma stabilizer being parallel to a rotational axis of the first vortex flow, wherein the one or more passageways of the adaptor are disposed on the bottom side of the waveguide.

2. A plasma generating system as recited in claim 1, further comprising:
    a programmable logic controller (PLC) communicatively coupled to the power supply by a daisy chain network.

3. A plasma generating system as recited in claim 2, wherein the daisy chain network includes an Ethernet cable.

4. A plasma generating system as recited in claim 2, further comprising:
a graphic user interface (GUI) communicatively coupled to the PLC.

5. A plasma generating system as recited in claim 1, further comprising:
one or more sensors communicatively coupled to and configured to exchange data with the module.

6. A plasma generating system as recited in claim 5, wherein the one or more sensors are coupled to the module by a cable harness.

7. A plasma generating system as recited in claim 1, further comprising:
a first flow rate sensor coupled to the module and configured to measure a flow rate of the first gas.

8. A plasma generating system as recited in claim 7, further comprising;
a valve coupled to the module and configured to control the flow rate of the first gas.

9. A plasma generating system as recited in claim 7, further comprising;
a flow inlet mounted on the top side of the waveguide and configured to introduce a second gas into the plasma cavity; and
a second flow rate sensor coupled to the module and configured to measure a flow rate of the second gas.

10. A plasma generating system as recited in claim 8, further comprising;
a valve coupled to the module and configured to control the flow rate of the second gas.

11. A plasma generating system, comprising:
a programmable logic controller (PLC); and
a plurality of reactor systems coupled to the PLC by a daisy chain network, wherein the PLC is configured to send a command to each of the plurality of reactor systems by sending a signal via the daisy chain network, each of the plurality of reactor systems including:
a microwave generator for generating microwave energy;
a power supply for providing electrical power to the microwave generator and including a controller that comprises:
at least one microprocessor; and
a module communicatively coupled to the at least one processor and including at least one of digital input-output (D10) and analogue input-output (A10).

12. A plasma generating system as recited in claim 11, wherein the daisy chain network includes an Ethernet cable.

13. A plasma generating system as recited in claim 11, further comprising:
a graphic user interface (GUI) communicatively coupled to the PLC.

14. A plasma generating system as recited in claim 11, wherein each of the plurality of reactor systems further includes:
one or more sensors communicatively coupled to and configured to exchange data with the module.

15. A plasma generating system as recited in claim 14, wherein the one or more sensors are coupled to the module by a cable harness.

16. A plasma generating system as recited in claim 11, wherein each of the plurality of reactor systems further includes:
a waveguide coupled to the microwave generator and configured to transmit the microwave energy therethrough;
an inner wall disposed within the waveguide to define a plasma cavity, a plasma being generated within the plasma cavity using the microwave energy;
an adaptor mounted on a first side of the waveguide and configured to introduce a first gas into the plasma cavity and including a gas outlet through which a gas processed by the plasma exits the plasma cavity; and
a first flow rate sensor coupled to the module and configured to measure a flow rate of the first gas.

17. A plasma generating system as recited in claim 16, further comprising;
a valve coupled to the module and configured to control the flow rate of the first gas.

18. A plasma generating system as recited in claim 16, further comprising;
a flow inlet mounted on a second side of the waveguide and configured to introduce a second gas into the plasma cavity; and
a second flow rate sensor coupled to the module and configured to measure a flow rate of the second gas.

19. A plasma generating system as recited in claim 18, further comprising;
a valve coupled to the module and configured to control the flow rate of the second gas.

20. A plasma generating system as recited in claim 11, wherein the command includes an instruction to make an adjustment to a reactor system power state.

21. A plasma generating system as recited in claim 18, wherein at least one of the plurality of reactor systems further includes:
a plasma stabilizer having a shape of a circular hollow cylinder and installed on a top side of the waveguide and protruding into the plasma cavity, wherein the one or more passageways of the adaptor are disposed on a bottom side of the waveguide.

* * * * *